United States Patent [19]

Schmitt-Landsiedel et al.

[11] Patent Number: 5,093,809
[45] Date of Patent: Mar. 3, 1992

[54] STATIC MEMORY HAVING PIPELINE REGISTERS

[75] Inventors: Doris Schmitt-Landsiedel, Ottobrunn; Bernhard Hoppe, Munich; Gerd Neuendorf, Germering; Maria Wurm, Ottobrunn, all of Fed. Rep. of Germany

[73] Assignee: Siemens Aktiengesellschaft, Munich, Fed. Rep. of Germany

[21] Appl. No.: 487,932

[22] Filed: Mar. 5, 1990

[30] Foreign Application Priority Data

Apr. 21, 1989 [DE] Fed. Rep. of Germany ....... 3913208

[51] Int. Cl.⁵ .............................................. G11C 7/00
[52] U.S. Cl. ................................ 365/230.03; 365/233; 364/DIG. 2; 395/425; 395/800
[58] Field of Search .............. 365/230.03, 230.01, 365/233, 189.01; 364/900 MS, 200 MS

[56] References Cited

U.S. PATENT DOCUMENTS 4,633,440 12/1986 Pakulski ...................... 365/230.05

OTHER PUBLICATIONS

"256×4 Bit Registered Self-Timed Static RAM 2.5 ns Cycle Time", Giga Bit Logi Inc., May 1988, pp. 2-2.
CMOS Data Book, "Advanced Information Self-Timed Pipeline Static RAMs", Cypress Semiconductors, 15 Jan. 1988, pp. 2-83.
"Principles of CMOS-VLSI-Design", Addison Wesley, Reading, MA, 1985, Chapter 5.4.

Primary Examiner—Joseph A. Popek
Attorney, Agent, or Firm—Hill, Van Santen, Steadman & Simpson

[57] ABSTRACT

Static memory having pipeline registers. The static memory has a plurality of hierarchy levels connected by pipeline registers. This architecture is very beneficial since the area requirements for the drive and read-out circuits in the first hierarchy level are especially critical. Advantageously, memory cells are used which have write and read word lines as well as separate write and read data lines and which also supply a strong cell signal so that only a few components are needed for the read circuit. A new clock format with an arrangement of pipeline registers is proposed for the appertaining memory for which power consumption is reduced by disconnecting the clocks in the lower hierarchy levels, resulting in increased area savings.

23 Claims, 5 Drawing Sheets

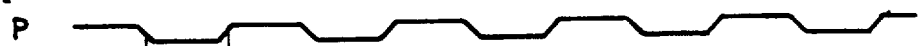
FIG. 3A $_P$
FIG. 3B $_{PM}$
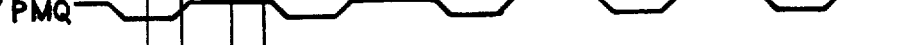
FIG. 3C $_{PMQ}$
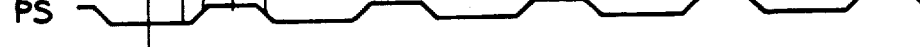
FIG. 3D $_{PS}$
FIG. 3E $_{PSQ}$
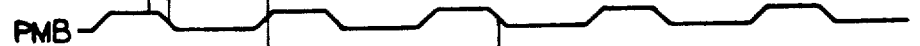
FIG. 3F $_{PMB}$
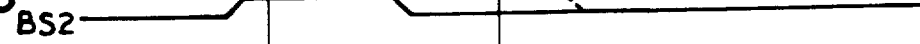
FIG. 3G $_{BS2}$
FIG. 3H $_{BS4}$
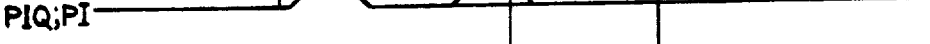
FIG. 3I $_{PIQ;PI}$
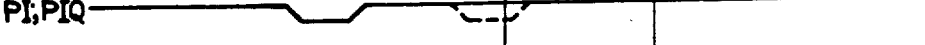
FIG. 3J $_{PI;PIQ}$
FIG. 3K $_{POQ;PO}$
FIG. 3L $_{PO;POQ}$
FIG. 3M $_{Z2I}$
FIG. 3N $_{RZ2}$
FIG. 3O $_{Z2Q}$ FIG. 4A PM
FIG. 4B PS
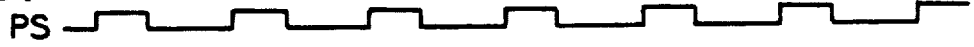
FIG. 4C PI
FIG. 4D PO
FIG. 4E EIN'
FIG. 4F E1'
FIG. 4G E2'
FIG. 4H E3'
FIG. 4I D3'
FIG. 4J D4'
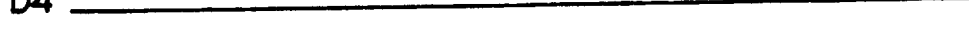
FIG. 4K DO'
FIG. 4L WR'

STATIC MEMORY HAVING PIPELINE REGISTERS

BACKGROUND OF THE INVENTION

The present invention is directed to a memory constructed hierarchically of memory cells with pipeline registers. The memory hierarchically is constructed of memory cells, whereby the memory cells are combined into memory groups and column and row circuits for selecting, reading and writing every memory cell in the memory group, the memory being divided into lower, middle and higher hierarchy levels.

Static memories (SRAMs) in CMOS technology operate either asynchronously, i.e. a write or read event is triggered by a change in the input data, or synchronously with a clock. Registers are connected to an input and an output of the static memories. Input data can be address signals, data input signals, chip enable signals or other control signals. Controlling the input of data by means of a clock can be advantageous because the input data is accepted at a defined time with reference to a system clock and output data is also available at a defined time. This facilitates the data transfer between the modules of a system operating at a predetermined frequency. Based on these considerations, synchronous static memories were developed, which are referred to as "registered SRAMs" or "pipelined SRAMs". Such synchronous SRAMs may be found in the publication, GaAs IC Data book and Designer's Guide, "256×4 Bit Registered Self-Timed Static RAM 2.5 ns Cycle Time", Giga Bit Logi Inc., May, 1988, page 2—2, as well as in the publication, CMOS Data Book, "Advanced Information: Self-Timed Pipeline Static RAMs", Cypress Semiconductors, Jan. 15, 1988, page 2-83. The static memories shown therein, however, contain only pipeline registers at their inputs and outputs.

In addition to the synchronization, it is a goal of pipeline architecture to provide an optimally high clock frequency for the operation of a circuit. This is achieved by dividing the data path into a plurality of sections that are operated in parallel clock-controlled chronologically for a plurality of data sets. After passing through a pipeline stage, the data are intermediately stored in registers. The shortest possible clock period is thereby defined by the pipeline stage or by the pipeline stages having the longest transit time. The overall running time of the data through this circuit is longer than the running time for a circuit without a pipeline structure. However, depending on the number of pipeline stages and the additional running time through the registers, the data rate can be significantly increased. This advantage is achieved at the expense of an additional area requirement for the pipeline registers as well as the generation and distribution of the clock signals.

A subdivision of the read or write event into further pipeline stages is not meaningful with conventional memory architecture without hierarchic stages. Following a pre-decoder stage that makes use of only a small part of the access time, the input signals can be branched to a plurality of word lines. Due to the great plurality of word lines, the drive levels required for the word line signal and the geometry parameters due to the cell grid, it is not meaningful to insert further pipeline registers into the address path at this location. The output data are selected from a plurality of data lines and are supplied to one or more read amplifiers. An intermediate storage is only meaningful following the read amplifier.

SUMMARY OF THE INVENTION

An object of the present invention is to provide a hierarchically constructed memory that contains a plurality of pipeline stages in medium and higher hierarchy levels.

These objects are inventively achieved by the features of the present invention wherein a first hierarchy level is formed by a memory cell, and wherein a second hierarchy level of memory cells combined into memory groups and every next-higher hierarchy level is constructed of elements of the next-lower hierarchy level. Every hierarchy level has a column and row circuit for selecting, reading and writing the elements of the hierarchy level allocated to it. Area-intensive circuit parts of the column and row circuits of the lower hierarchy levels are realized in higher hierarchy levels. A plurality of pipeline stages are located between the appertaining column and row circuits in the middle and higher hierarchy levels. The memories have a central clock supply allocated to them and every element of the higher hierarchy level has a respective input/output clock generator allocated to it, whereby the input/output clock generators control the input and output of data into and out of the elements of the higher hierarchy level.

When a high data rate is especially important, a hierarchic memory having a pipeline structure according to the present invention can be advantageously utilized during a waiting time of several clock periods between the application of an address and the read-out of the appertaining data without disturbing the writing of the memory cells.

These memories can therefore be especially optimally used in fast testers or in digital signal processing.

In a preferred embodiment of the present invention the memory cells are static memory cells and every memory cell is equipped with a data line for writing information into the memory cell and with a data line for reading information out of the memory cell. Decoder circuits for column address and row address lines in the column and row circuit of the lower hierarchy level are realized in a higher hierarchy level.

The higher hierarchy level contains five pipeline stages sequentially arranged following one another. First dynamic registers are located at inputs of the first pipeline stage, second dynamic registers are located between outputs of the first pipeline stage and inputs of the second pipeline stage, fourth dynamic registers are located between outputs of the third pipeline stage and inputs of the fourth pipeline stage, and fifth dynamic registers are located between outputs of the fourth pipeline stage and inputs of a fifth pipeline stage. Static registers and static registers having reset circuits are present between outputs of the second pipeline stage and inputs of the third pipeline stage. The first pipeline stage contains decoder circuits for the decoding of the row and column address lines and contains amplifier circuits for write, read and data input lines. The second pipeline stage contains amplifier circuits for the row and column address lines and for the write/read and data input lines. The third pipeline stage contains elements of the next-lower hierarchy level and an input-output clock generator is allocated to every element, whereby the most significant, decoded address bits are connected to the input/output clock generators as block select signals. The third and fourth pipeline stage contains a plurality of NOR gates and the fifth pipeline stage contains a NAND gate that respectively serve the purpose of combining data output lines of the elements of the next-lower hierarchy level. The dynamic registers are connected for control to second, third, fourth and fifth clock outputs.

The central clock supply contains a clock input and five clock outputs, a second NAND gate, a fourth NOR gate, third and fourth transfer gates, and twenty-eight inverters. The clock input is connected to a first input of the second NAND gate and to a first input of the fourth NOR gate. An output of the second NAND gate is connected via a twelfth inverter to a second input of the fourth NOR gate. An output of the fourth NOR gate is connected via an eleventh inverter to the second input of the second NAND gate. The output of the second NAND gate is connected to the first clock output of the central clock supply via three inverters sequentially connected following one another. The output of the second NAND gate is connected to the second clock output of the central clock supply via the third transfer gate in series with a first group of six inverters sequentially connected following one another. A second group of six inverters sequentially connected following one another is connected between the output of the twelfth inverter and the third clock output of the central clock supply. A third group of six inverters sequentially connected following one another is connected between the fourth clock output and an output of the eleventh inverter. The output of the fourth NOR gate is connected to the fifth clock output of the central clock supply via a fourth transfer gate in series with a fourth group of six inverters sequentially connected following one another.

Every input/output clock generator contains an input clock and an output clock generator, a third, fourth and fifth inverter, a third dynamic register and a transfer gate. They further have a clock control input, a clock select input as well as four clock outputs. The block select input is connected to the first input of the input clock generator and, via a third inverter, the first transfer gate and the third dynamic register are connected to a first input of the output clock generator. The clock control input is connected to a second input of the input clock generator and, via a fourth inverter, is connected to a second input of the output generator. The output of the fourth inverter is also connected to a first control terminal of the third dynamic register and, via a fifth inverter to a second control terminal of the third dynamic register in common with a control terminal of the first transfer gate. The input/output clock generator respectively each have first and second clock outputs. The input clock generator contains a third NAND gate, five inverters and a fifth transfer gate and the output clock generator contains a fourth NAND gate, a further five inverters and a sixth transfer gate. The first input of the input clock generator is connected to a first input of the third NAND gate and the second input of the input clock generator is connected to a second input of the third NAND gate. An output of the third NAND gate forms the first clock output of the input clock generator via a first group of three inverters connected following one another and also forms the second clock output of the input clock generator via a fifth transfer gate in series with a first group of two inverters connected following one another. The first input of the output generator is connected to a first input of a fourth NAND gate and the second input of the output clock generator is connected to a second input of the fourth NAND gate. An output of the fourth NAND gate represents the first clock output of the output clock generator via the sixth transfer gate in series with a second group of two inverters connected following one another and represents the second clock output of the output clock generator via a second group of three inverters connected following one another.

In the preferred embodiment a dynamic register contains two transfer gates and two inverters connected following one another and the two inverters are connected between the first and second transfer gates. Also in the preferred embodiment a static register contains two transfer gates, a first, a second and a third inverter. The first and second inverters are connected in series between the first and second transfer gates, whereby the first inverter and the first transfer gate are located in the input region and the second transfer gate and the second inverter are located in the output region of the static register. The third inverter forms a feedback connection between an output of the first inverter and an input of the first inverter. Further in the preferred embodiment in a static register having a reset circuit, the reset circuit is located between a seventh and an eighth transfer gate. The reset circuit contains two block select inputs, a fifth NOR gate, thirteenth through eighteenth inverters and a fifth NAND gate. The first block select input is connected to a first input of the fifth NOR gate and the second block select input is connected to a second input and, via the thirteenth, fourteenth and fifteenth series-connected inverters, is connected to a third input of the fifth NOR gate. An output of the fifth NOR gate is connected via a sixteenth inverter to a first input of the fifth NAND gate. An output of the seventh transfer gate is connected to a second input of the fifth NAND gate. An output of the fifth NAND gate is fed back via the seventh inverter to the second input of the fifth NAND gate. The output of the fifth NAND gate is connected via the eighteenth inverter to the eighth transfer gate and to the nineteenth inverter.

In the preferred embodiment the memory is a 16K memory that is divided into 16×1K blocks in the higher hierarchy level, whereby a 1K block is constructed of sixteen blocks of 64 bits each as well as of an input/output clock generator. The memory has address lines, a write/read line, a data input line and data output line and a clock input allocated to it. The uppermost addresses are decoded into block select signals via a 4:16 address decoder in the first pipeline stage, the block select signals being supplied via a first inverter to respectively one block select input of the appertaining input/output generator. The middle addresses are each decoded into four row and column address lines via two 2:4 decoders, the row and column address lines serving for the selection of rows or columns of 64 bit blocks. The lower addresses are decoded into eight row and column address lines via two 3:8 decoders, the row and column address lines serving for the selection of a row or column within the 64 bit blocks. The amplifier circuits for the lower and middle, decoded row and column address lines in the second pipeline stage and the amplifier circuits for the write/read line and for the data input line in the first and second pipeline stage are each composed of two series-connected inverters. The four row address lines for the selection of a row of 64 bit blocks are connected to every 1K block via a respective static register having a reset circuit and the four column lines for the selection of a column of 64 bit blocks, the eight row lines and eight column lines that serve for the selection of rows or columns within the 64 bit blocks are each connected to every 1K block via a static register. The write/read line at the input of the third pipeline stage is split into a write line and into a read line, whereby the read line is connected via a respective static register to a 1K block and the write line is connected to the 1K block via a respective static register at the output of the first transfer gate of the appertaining static register via an inverter having a following transfer gate. The four rows of the date lines of the 64 bit blocks are combined via first NOR gates having four inputs and one output, whereby the first NOR gate is located within the fourth dynamic register at the output of the third pipeline stage and at the input of the fourth pipeline stage. A resistor element has a first terminal connected to the output of the third pipeline stage and input of the fourth pipeline stage and has a second terminal connected to a reference potential. Respectively eight of the sixteen data lines of the 64 bit blocks are combined via second and third NOR gates having eight inputs and one output, one NOR gate with a connected inverter is located in the fourth pipeline stage and the outputs of these two NOR gates are further combined at a first NAND gate having two inputs and one output, whereby the first NAND gate is located within the fifth dynamic register at the output of the fourth pipeline stage and input of the fifth pipeline stage. The central clock supply has second through fifth clock outputs connected to the first, second, fourth and fifth registers and the first and second clock outputs of the input clock generator are connected to the static registers and to the static registers having reset circuit, whereas the first and second clock outputs are connected to the fourth dynamic registers.

In the preferred embodiment a transfer gate is constructed of a field effect transistor of a first type and of a field effect transistor of a second type. The field effect transistor of the first type is connected in parallel with the field effect transistor of the second type. A gate terminal of the field effect transistor of the second type forms the second control input and a gate terminal of the field effect transistor of the first type forms the first control input of a transfer gate. A field effect transistor of the first type is an n-channel field effect transistor and a field effect transistor of the second type is a p-channel field effect transistor.

BRIEF DESCRIPTION OF THE DRAWINGS

The features of the present invention which are believed to be novel, are set forth with particularity in the appended claims. The invention, together with further objects and advantages, may best be understood by reference to the following description taken in conjunction with the accompanying drawings, in the several Figures in which like reference numerals identify like elements, and in which:

FIGS. 3A-3O depict timing diagrams for the clock generation and the resetting of Z2 signals of FIG. 2, more specifically, FIG. 3A depicts the waveform of the clock at the clock input P of a central clock supply, FIGS. 3B-3E depict the clock pairs PM, PMQ and PS, PSQ supplied to dynamic registers, FIGS. 3G and 3H depict block select signals, FIGS. 3I-3L depict the clock pairs PI, PI' and PIQ, PIQ' and PO, PO' and POQ, POQ' received by the static registers, and FIGS. 3M-3O depict the input signal Z2I, the reset signal RZ2 and the output signal Z2Q for a static register having a reset circuit;

FIGS. 4A-4L depict timing diagrams for the signal course through successive pipeline stages, more specifically, FIGS. 4A-4D depict the clock signals PM, PS, PI and PO, FIGS. 4E-4H depict the signal waveforms through successive pipeline stages P1, P2 and P3, FIGS. 4I-4K depict the signal waveforms D3', D4' and DO' for a read event, and FIG. 4L depicts the signal waveform WR' for a write event;

DESCRIPTION OF THE PREFERRED EMBODIMENT

Differing from conventional, static memories, the hierarchic structure of the present invention makes it possible to insert a plurality of pipeline stages in the middle and upper hierarchy levels since the plurality of signals to be stored at those levels is not that great and non-addressed sub-blocks can be disconnected from the pipeline mode. The running time through the lower hierarchy level is noticeably shorter than the overall access time. The minimum clock period that can be achieved is therefore also significantly shorter than in traditional, synchronous static memories.

Figure 1:
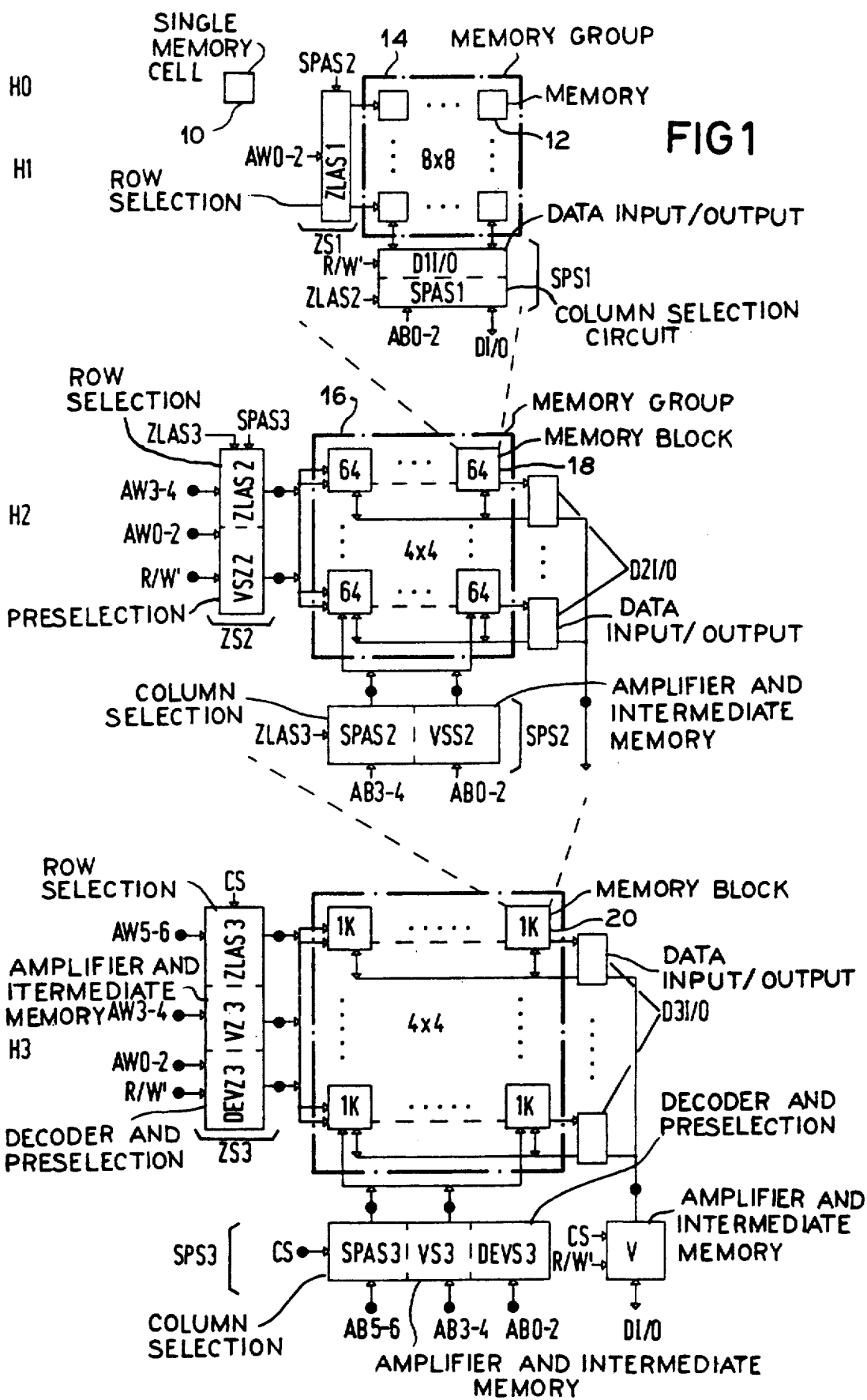
FIG. 1 is a block circuit diagram of a memory of the present invention having four hierarchy levels and inserted pipeline registers.

As an example, the block circuit diagram of a hierarchic 16K SRAM having inserted registers in second and third hierarchy levels is shown in FIG. 1. The basic hierarchic structure thereby corresponds to FIG. 2 in the patent application 88 E 1877 DE (hereby incorporated by reference), "Static Memory". Based on simulations for 1 μm CMOS technology, the access time of a hierarchic 16K SRAM having on-chip input and output circuits is about 11 nanoseconds. In the present state of the art, the time-critical stage requires about 9 nanoseconds transit time between the input and output without taking the input-output circuits into consideration. The transit time between the input and output of the second hierarchy level amounts to about 4 nanoseconds. Using the pipeline stage of the present invention, the clock period can be reduced to about half in comparison to clocked memories constructed with hierarchic architecture or the clock period can be reduced by about one-third in comparison to a conventional architecture without hierarchic structure.

FIG. 1 is a block diagram of an exemplary static 16K memory having hierarchic pipeline architecture. In this example, the memory is constructed with four hierarchy levels. The first hierarchy level H0 is formed by a single memory cell 10, whereas 8×8 memory cells 12 are combined into a memory group 14 on the second hierarchy level H1. In the third hierarchy level H2, 4×4 memory groups 16 are combined, every memory group 16 containing 64 memory cells 18. In the fourth hierarchy level H3 4×4 blocks 20 are arranged, whereby every one of these individual blocks 18 has a storage capacity of 1K bits and is constructed similarly to the 4×4 memory groups on the third hierarchy level H2. The division of the overall memory into four hierarchy levels was selected in order to guarantee a fast access time for good space exploitation. Other divisions are possible and are determined by the requirements of the application.

A new decoding scheme must be developed for a hierarchically organized static memory. In order to achieve optimally low power consumption of the static memory and in order to reduce the delay time that results from a high "fan-out" of the multiplexes and decoder circuits on the respective hierarchy level, it is not advantageous to activate the data inputs and the low address lines for all memory groups on every hierarchy level. Instead, it is advantageous to pre-select signals on these lines on higher hierarchy levels. This is enabled by the use of block select signals that are generated by the more significant address bits. As a result thereof, the pre-selected address and data signals are forwarded only to the pre-selected sub-blocks. If, however, all signals on the data lines and low address lines were selected on every hierarchy level, this would cause too long a delay time because of the required gate arrangements in the decoder path. In order to avoid this, parts of the decoding are divided into blocks operating parallel.

Accordingly, a data input and data output circuit D1I/O is allocated to all columns of 8×8 memory cells on the second hierarchy level, whereas a data input and data output circuit D2I/O is provided on the third hierarchy level H2 per row of 64 memory row elements. Similarly one data input and data output circuit D3I/O is allocated to a row of 1K memory blocks on the fourth hierarchy level H3. The data lines of the fourth hierarchy level H3 are connected to an amplifier and intermediate memory that allows a designational data writing and reading for the static memory. For this purpose, the amplifier and intermediate memory is driven with a chip select signal CS and with a write/read signal R/W'. As is depicted in FIG. 1, a respective row and column circuit ZS1, ZS2, ZS3 or, SPS1, SPS2, SPS3 is present in the second, third and fourth hierarchy level H1, H2 and H3, respectively, but are differently designed for every hierarchy level. On the fourth hierarchy level H3, the column circuit SPS3 contains a column selection circuit SPAS3 for the most significant address bits AB5 and AB6, an amplifier and intermediate memory VS3 for the address bits of the bit lines AB3 through AB4 and a decoder and pre-selection means DEVS3 for the least significant address bits of the bit lines AB0 through AB2. Likewise, the row circuit ZS3 of this hierarchy level contains a three-fold division composed of a decoder and pre-selection means DEVZ3 for the least significant address bits of the bit lines AW0 through AW2 and of the write/read signal R/W', an amplifier and intermediate memory VZ3 for the address bits of the word lines AW3 through AW4 and a row selection circuit ZLAS3 for the most significant address bits of the word lines AW5 and AW6. Both the row circuit ZS3 as well as the column circuit SPS3 on this hierarchy level are respectively driven with chip select signals CS. The decoder means in the row and column circuit DEVZ3, DEVS3 on the hierarchy level H3 decodes the least significant address bits AB0 through AB2 or AW0 through AW2 that are not required until the second hierarchy level H1. So that it is not necessary to supply the least significant address bits to all of the 1K blocks, they are pre-selected using the most significant address AW5 and AW6 or, AB5 and AB6, and are applied to only one row or one column of 1K blocks. This is enabled by internally generated block select signals in the row and column circuit ZS3, SPS3. On the fourth hierarchy level H3, respective registers are connected at the inputs and outputs of the row circuit ZS3 as well as of the column circuit SPS3, being connected between the amplifier and intermediate memory V and the data input and output circuits D3I/O. As a result the static memory of the fourth hierarchy level is further self-divided into two stages with respect to the address lines and the data input and output lines. On the third hierarchy level, the column circuit SPS2 contains a pre-selection means VSS2 to which the decoded, least significant address bits of the bit lines AB0 through AB2 are supplied and also contains a column selection circuit SPAS2 to which the address bits of bit lines AB3 and AB4 are connected.

The row selection signal from the row selection circuit ZLAS3 of the hierarchy level H3 is also required for the memory circuit SPS3. The row circuit ZS2 of the hierarchy level H2 also contains a two-fold division composed of the pre-selection means VSZ2 to which the decoded, least significant address bits of the word lines AW0 through AW2 and the pre-selected write/read signal R/W' are supplied and of the row selection circuit ZLAS2 to which the addresses of the word lines AW3 and AW4 are connected. The row circuit ZS2 on the third hierarchy level H2 is driven from the column selection signal of the column selection circuit SPAS3 and the row selection signal of the row selection circuit ZLAS3 of the fourth hierarchy level H3. Also on the third hierarchy level H2 the least significant, decoded address bits AB0 through AB2 or AW0 through AW2 are preselected and are applied to only one column or row of memory groups composed of 64 memory cells. This is achieved by internally formed block select signals that are generated from the addresses of the bit lines AB3 and AB4 or AW3 and AW4. The pipeline registers in the third hierarchy level are connected at the same location as in the fourth hierarchy level. They are situated between the inputs and outputs of the column circuit SPS2 and the inputs and outputs of the row circuit ZS2. Further, registers are connected preceding the data input and output circuits D2I/O. In a common view of all hierarchy levels, a division of five pipeline stages results between address and data input lines and the data output lines. Finally, in the second hierarchy level H1 the column circuit SPS1 contains a data input and output circuit D1I/O as well as a column selection circuit SPAS1. The data input and output circuit D1I/O controls the bidirectional data traffic between the individual memory cells of the memory group. The decoded, least significant address bits are the bit lines AB0 through AB2 and the data input and output lines DI/O are therefore connected to the column circuit SPS1. Thereby provided for driving are a preselected write/read signal R/W' for the data input/output circuit D1I/O and a row selection signal ZLAS2 that is formed in the row selection circuit ZLAS2 within the third hierarchy level H2. The row selection circuit ZS1 of the memory groups in the hierarchy level H1 contains only a row selection circuit ZLAS1 to which the decoded, least significant address bits of the word line AW0 through AW2 are supplied and that is controlled by a column selection signal. The column selection signal is again taken from the column selection circuit SPAS2 of the next-higher hierarchy level H2.

A block circuit diagram for the five pipeline stages of a hierarchy 16K static memory shall now be described. The realization can be advantageously implemented using memory cells with various modifications such as disclosed in patent application 88 E 1876 DE, "Static Memory Cell". The elimination of a write recover time is of particular significance. A write recovery time for pre-charging the bit lines is required after writing in conventional static memories. In order to control these events, an extremely short external write pulse must be applied or a write pulse must be internally generated. The shortest possible write cycle generally lasts at least as long as the minimum read cycle. However, this also means that, in a pipeline architecture, the same high clock frequency cannot be utilized during write-in as during read-out since there must be a delay for the write recovery time to elapse after every write-in, that is, before the next access can occur.

It is desirable, however, that the static memory be operated with the same clock frequency during reading and writing. This is possible by using memory cells that are disclosed in patent application 88 E 1876 DE. As a result of the short word and data lines, such memory cells can be considered to be a register in a logic circuit. Since a data signal having a maximum CMOS level is achieved instead of the usual difference signals on a data line pair, an inverter can be used for the readout circuit, which is far more space-saving than a standard differential amplifier. Due to the elimination of area-intensive analog circuit parts that involve high design requirements, the utilization of memory cells yields an increased reliability even when there is technology modifications, a shortening of the access time when using the hierarchic architecture, as well as an absence of timing problems, for example when generating the write pulse and when pre-charging the lines.

A general problem of pipeline circuits is that a plurality of registers is switched at every clock cycle. A high power consumption results and complex area-intensive circuits are also required in order to generate the various clock phases with adequate driver strength. In a large circuit where the clocks are connected across great distances, a pseudo two-phase system having four clock signals PM, PMQ, PS and PSQ is generally used to prevent signal interference, as depicted in FIGS. 3A–3D. Pseudo two-phase clock systems are known from the publication by N. Weste, K. Eshragian, "Principles of CMOS-VLSI-Design", Addison Wesley, Reading, Mass., 1985, chapter 5.4.

Only a small part of the circuit is actually required, however, at every access in a hierarchic static memory, namely the circuit parts of the highest hierarchy level as well as the addressed blocks of the lower and middle hierarchy levels. The memory of the present invention generates a system of main clocks only for the highest hierarchy level and generates clocks for the registers on the middle and lower hierarchy levels only in the respective block being addressed. This can be achieved by a logical operation of a clock signal synchronized with the main clocks but chronologically advanced with block select signals.

Figure 2:
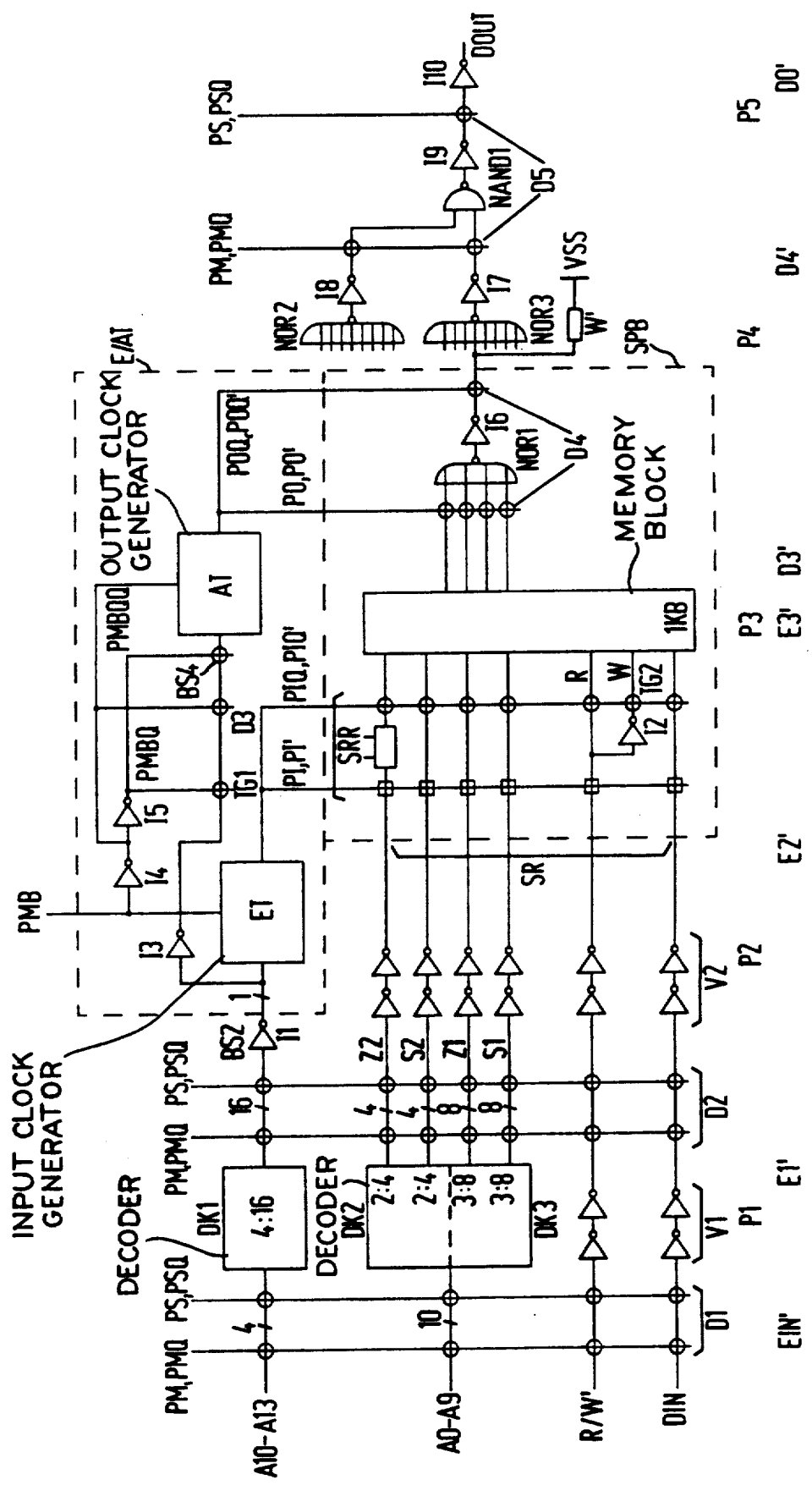
FIG. 2 is a block circuit diagram of a 16K memory of the present invention having five pipeline stages.
Figure 5:
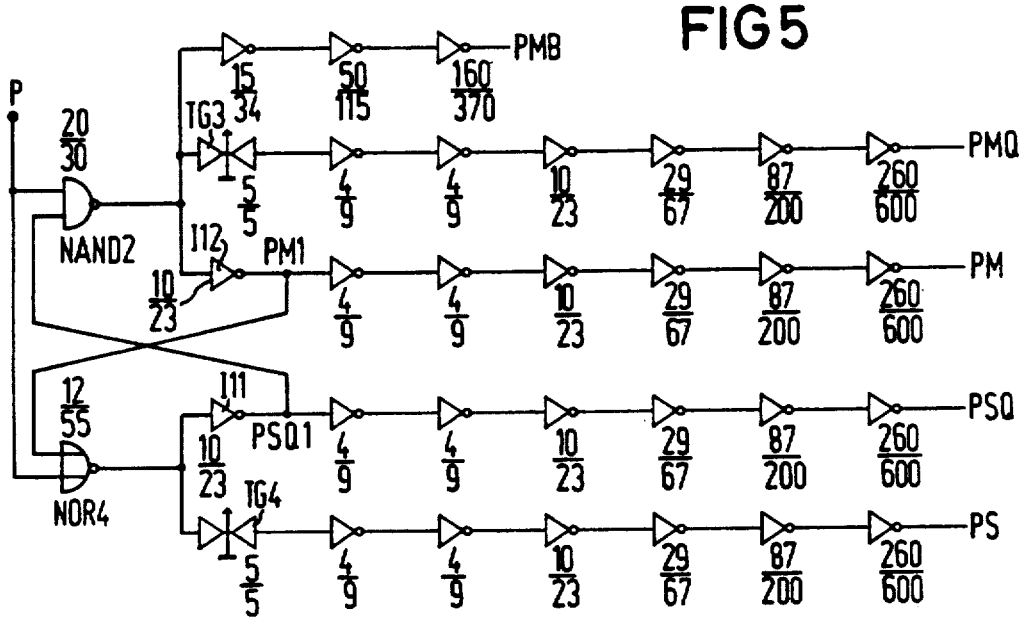
FIG. 5 is a circuit diagram of a central clock supply.

FIG. 2 shows an exemplary 16K static memory having pipeline structure according to the above-recited principle. FIGS. 3A–3O and FIGS. 4A–4L contain the timing diagrams for generating the clocks and the signal course through the successive pipeline stages. Embodiments of the circuits for clock generation are depicted in FIG. 5 and in FIG. 6.

For illustration, the signal waveform for a read event shall be described with reference to the block circuit diagram of FIG. 2. The illustrated hierarchic 16K SRAM is divided into 16 1K blocks each of which is composed of 16 64-bit blocks. All input signals DIN, R/W', A0 through A9 and A10 through A13 are first synchronously written into a group of dynamic input registers D1. The clocking occurs by using clock signals PM, PMQ and PS, PSQ from the central clock supply. Fourteen input registers are available for the address line A0 through A13 and one input register is available for the write/read line R/W' and for the data input line DIN. The addresses are decoded in the following, first pipeline stage P1. Some address lines, the most significant, such as the four addresses A10 through A13 in the example, will be used for block selection. They are decoded in a 4:16 decoder DK1 to form block select signals BS2. The lower addresses A0 through A9 are used for selection within the middle and lower hierarchy levels. Accordingly, two address pairs are decoded in 2:4 decoders DK2 to each form four Z2 and S2 signals that are intended to serve for the selection of a row or column of the 64 bit blocks. Three address lines are decoded in 3:8 decoders DK3 to form Z1 and S1 signals that serve for row and column selection within the 64 bit blocks. The data input signal DIN and the write/read signal R/W' can be intermediately stored in registers for synchronization and in a group of amplifiers V1.

A second group of dynamic registers D2 is connected to the output of the first pipeline stage P1 and to the input of the second pipeline stage P2. Serving this purpose are 16 dynamic registers for the block select signals BS2, 4 dynamic registers each for the Z2 and S2 signals, 8 dynamic registers each for the Z1 and S1 signals and one dynamic register each for the write/read signal R/W' and the data input signal DIN. The signals Z2, S2, Z1, S1, R/W' and DIN are amplified in the second pipeline stage P2 and are supplied to all memory blocks SPB. An input/output clock generator E/AT is allocated to each of the 16 memory blocks SPB. Each of the block select signals BS2 is supplied via an inverter I1 to one of the input/output clock generators E/AT. In addition, an advanced clock signal PMB from the central clock supply is supplied to all input/output clock generators E/AT. Clock signals PI, PIQ, PI', PIQ' for driving the group of static registers SR and the static registers having a reset circuit SRR are generated from the chronologically advanced clock signal PMB and from the block select signal BS2 for the 1K block just selected. These input registers are static so that no undefined statuses can occur in the selected 1K block. Moreover, the write/read signal R/W' is split into two signals, R and W in this register stage. Static registers having a reset circuit SRR that allow the signals to be deactivated after the de-selection of the block are used for each of the four Z2 signals.

More specifically, an input/output clock generator E/AT is constructed as follows. The generator E/AT contains input and output clock generators ET, AT, three inverters I3, I4, I5, a transfer gate TG1 and a dynamic register D3. The block select signal BS2 is supplied to a first input of the input clock generator ET and is connected to a first input of the output clock generator AT via the inverter I3, the transfer gate TG1 and the dynamic register D3. The chronologically advanced signal PMB is supplied to a second input of the input clock generator ET, this signal PMB also being supplied to a second input of the output clock generator AT via an inverter I4. The dynamic register D3 is driven via the inverter I4 (signal PMBQQ) and receives the chronologically advanced clock signal PMB via a series circuit of I4 and I5 (signal PMBQ). The transfer gate TG1, is also connected to the output of the inverter I5. The output of the input clock generator ET has a first clock output having the clock signal PI, PIQ' and a second clock output having the signal PIQ, PI', whereas the output clock generator AT provides the signals PO, POQ' or POQ, PO' on its first and second clock outputs.

The memory block SPB in the third pipeline stage P3 contains the group of static registers SR, the static registers having reset circuit SRR, the 1K memory block 1KB, dynamic registers D4, as well as a NOR gate NOR1 with a following inverter I6 for combining the data output lines of the 1K memory block 1KB.

The circuit of the memory block SPB is described in more detail as follows. The four Z2 signals Z2 are conducted via static registers having a reset circuit SRR which themselves are driven with block select signals BS2 and BS4, whereas static registers are used for the other leads such as the address lines A0 through A9, the write/read line R/W' and the data input line DIN. Consequently, four static registers having reset circuits are required for the Z2 signals, four static registers are required for the S2 signals, eight static registers are required for the Z1 and S1 signals and one static register each is required for the write/read signal R/W' and for the data input signal DIN. The write/read signal R/W' is split into a read signal R and into a write signal W using an inverter I2 and a following transfer gate TG2. The inverter I2 is thereby connected between the two transfer gates of the static register of the write/read line R/W'. All leads of the group of static registers having reset circuits SRR and of the group of static registers SR are connected to the 1K block 1KB. Registers D4 for the output data are attached to the output of the 1K block 1KB. There are various possibilities of combining the data lines of the 64 bit blocks with respect to running time and area requirement.

In FIG. 2, four data lines from the four rows of 64 bit blocks are stored in four first half-registers (first part of D4). These signals are "active high", i.e. only the line of the selected row, for a stored 1 in the selected memory cell, can receive a high, positive voltage value. Within the register, the four signals are combined to form an output signal by a NOR operation in the NOR gate NOR1 and the following inverter I6. This output signal is stored in a second half-register (second part of D4). The two output half-registers D4 are driven by clock signals PO, PO' and POQ, POQ'. The output of the second half-register D4 is connected via a resistor element W' to a reference potential VSS (in this case ground) in order to keep the output of non-selected blocks at low potential. For example, the resistor element can be realized with a field effect transistor (n-channel type) whose gate terminal is connected to the drain terminal and to the output of the second half-register D4 and whose source terminal is connected to the reference potential. The fourth and the fifth pipeline stages P4 and P5 provide a further combination of the output lines from the 16 1K blocks. The fourth pipeline stage P4 contains two NOR gates NOR2, NOR3 each having respectively eight inputs and one output, whereby the outputs are connected to inverters I7 and I8, respectively. For further combinations of the two output lines, the dynamic register D5 is connected to the output of P4 and to the input of P5. It contains a two-fold NAND gate NAND1 having a following inverter I9, whereby this gate is inserted within the output register D5. The output register D5, driven with the main clocks PM, PMQ and PS, PSQ, is followed by an output driver 110.

A dynamic register according to D1 through D5 is constructed using two transfer gates and two inverters connected following one another, whereby the two inverters are located between the first and second transfer gates. Instead of the one inverter, a NOR gate NOR1 or an NAND gate NAND1 is inserted within the dynamic registers D4 and D5.

A static register from the group of static registers SR contains two transfer gates, a first, second and third inverter. The first and second inverters are connected in series between the first and second transfer gates, whereby the first inverter is located in the input region of the static register and the second inverter is located in the output region of the static register. The third inverter provides a feedback connection between an output of the first inverter and an input thereof.

Figure 7:
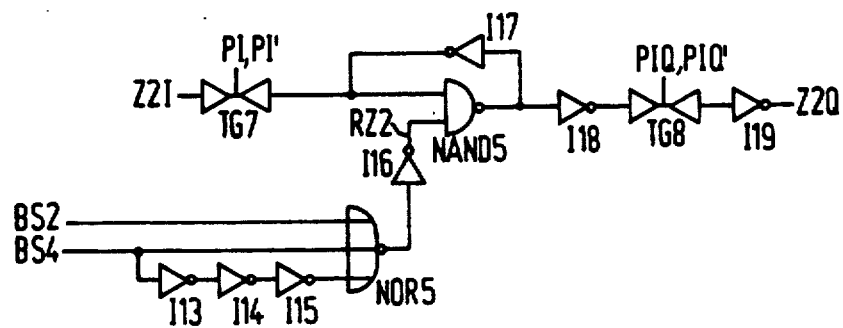
FIG. 7 is a circuit diagram for a static register having reset circuits.

The static register having reset circuit is depicted in more detail in FIG. 7.

Additional control signals such as the chip enable signal CE or the output enable signal OE are not shown in FIG. 2. Depending on the demands of the application, such signals can be synchronously or asynchronously co-processed. The output enable signal can asynchronously control a tri-state output driver. Alternatively, an external or an internal output enable signal obtained by an AND operation from the chip enable signal and the write/read signal can be intermediately stored in synchronous registers until the associated output data becomes valid and can then synchronously the control output driver. A chip enable signal can likewise only control individual circuit parts, for example the output driver. It is also possible that the central clock supply can be stopped at a defined status with the chip enable signal or with a standby signal.

In the example of FIG. 2, the registers SRR, SR for block input signals must be activated one clock period before the registers D4 for output data for a read access. Two clock pairs are therefore generated: A first clock pair PI, (PI'), PIQ, (PIQ') for the input registers SRR, SR by operation of the chronologically advanced clock PMB with the block select signal BS2 and a second clock pair PO, (PO'), POQ, (POQ') for the output registers D4 by an operation of the chronologically advanced clock PMB with the block select signal BS4. Since the disconnectable block clocks have to be distributed only within a 1K block, a simple two-phase clock strategy can be respectively selected here. In order to obtain the block select signal BS4, the block select signal BS2 in the 1K block is delayed by one and one-half clock periods in three half registers (referenced with reference characters TG1 and D3 in FIG. 2). These three half-registers are driven by clocks PMBQ and PMBQQ generated from the clock signal PMB. The input/output clock generator E/AT is fashioned such that the inner half-register is opened in a deselected 1K block and the outer half-register which is connected to the periphery is blocked. In combination with the afore-mentioned static input registers, stable levels result in the de-selected blocks and the combination of the output data is simplified. An even deeper graduation with further disconnectable clock pairs can be used for larger static memories.

FIGS. 3A–3O and FIGS. 4A–4L depict timing diagrams for generating the clocks and the signal course through the successive pipeline stages. Since, as already described, a dynamic register, a static register or a static register having a reset circuit respectively contains a transfer gate at the input and a transfer gate at the output, it is necessary to provide a mutually inverse clock pair for every transfer gate. In accordance therewith, the group of dynamic registers D1, D2 and D5 is respectively supplied with the clock pairs PM, PMQ and PS, PSQ; the group of static registers SR and static registers having reset circuit SRR receive the clock pairs PI, PI' and PIQ, PIQ' and, finally, the clock pairs PO, PO' as well as POQ and POQ' are supplied to the dynamic registers D4. Since the two transfer gates of the group of static registers SR, those of the static registers having reset circuits SRR, and also the dynamic registers D4 are respectively driven with inverse clock signals PI, PIQ or PO and POQ, the following clock pairs correspond to one another: PIQ' and PI, PI' and PIQ, POQ' and PO, as well as PO' and POQ. In addition to the signal curves for these clocks (FIGS. 3I-3L), those of PM and PMQ, as well as PS and PSQ are shown in FIGS. 3B-3E, respectively. The waveform of the clock at the clock input P of a central clock supply is deposited in FIG. 3A. How the clocks PM, PMQ, PS, PSQ as well as PMB are generated therefrom is set forth in greater detail in FIG. 5. The block select signals BS2 and BS4 (FIGS. 3G and 3H) are likewise reproduced, whereby the block select signal BS2 is supplied to the input clock generator ET and the block select signal BS4 is supplied to the output clock generator AT. Finally, FIGS. 3M, 3N and 3O show the Z2 signals at the input Z2I as well as at the output Z2Q of a static register having a reset circuit. The reset signal RZ2 is a signal internally generated in the static register having a reset circuit.

FIGS. 4A-4L shows the signal waveforms through the successive pipeline stages P1-P5. The clock signals PM, PS, PI and PO are again entered in FIGS. 4A-4D. Dependent thereon, the signal waveforms are shown in FIGS. 4E-4H for EIN', E1', E2' and E3' through the successive pipeline stages P1, P2, and P3. The read event is reproduced by the signal waveforms in D3', D4' and DO' and shown in FIGS. 4I, 4J and 4K. The writing to the memory cells, shown by WR' in FIG. 4L, occurs in the same time segment as a read event D3'. The time at which the signal appears at the locations E1' through DO' of the memory is entered with cross-hatching in FIG. 4E-4L.

Given a suitable division of the decoder circuits and line drivers, the pipeline stage having the longest transit time will generally be the section through the lowest hierarchy level, in this example the 1K block. Without limitation of the maximum clock frequency, it is therefore possible to select a pseudo two-phase clock pattern having locked master and slave clocks for the periphery. Standard methods for generating locked clocks can be used for this method as described, for example, in the publication by C. Mead, L. Conway, "Introduction to VLSI Systems", Edison Wesley, Reading, Mass., 1980, chapter 7. However, the dead time between two active clock phases must not become excessively long. In the circuit of FIG. 5, the main clocks are not locked relative to one another; but rather, the chronologically advanced signals are used for that purpose, these being the signals PM1 instead of PM and PSQ1 instead of PS in FIG. 5.

FIG. 5 shows the central clock supply having a clock input P and five clock outputs PMB, PMQ, PM, PSQ and PS. The clock outputs PMQ and PM supply clock signals which are inverse relative to one another, just as the clock outputs PSQ and PS. The central clock supply contains a NAND gate NAND2, a NOR gate NOR4, two transfer gates TG3 and TG4 and 28 inverters. Regarding the transfer gates, the gate terminal of the n-channel field effect transistor is connected to the positive reference potential (VDD) and the gate terminal of the p-channel field effect transistor is connected to the negative reference potential (ground here), so that both transfer gates are always transmissive and only effect a transit time equalization. The clock input P is connected to a first input of the NAND gate NAND2 and to a first input of the NOR gate NOR4 and an output of the NAND gate NAND2 is connected via an inverter I12 to the second input of the NOR gate NOR4. Further, an output of the NOR gate NOR4 is connected via an inverter I11 to the second input of the NAND gate NAND2. The first output of the central clock supply PMB is connected to the output of the NAND gate NAND2 via three inverters sequentially connected following one another. Also, the output of the NAND gate NAND2 is connected to the second output PMQ of the central clock supply via the transfer gate TG3 with a first group of six inverters sequentially connected following one another. A second group of six inverters sequentially connected following one another is connected between the third clock output PM and the output of the inverter I12. A third group of six inverters sequentially connected following one another is connected between the fourth clock output PSQ and the output of the inverter I11 and, finally, the output of the NOR gate NOR4 is connected to the fifth clock output PS of the central clock supply via a transfer gate T4 in series with a fourth group of six inverters sequentially connected following one another.

Figure 6:
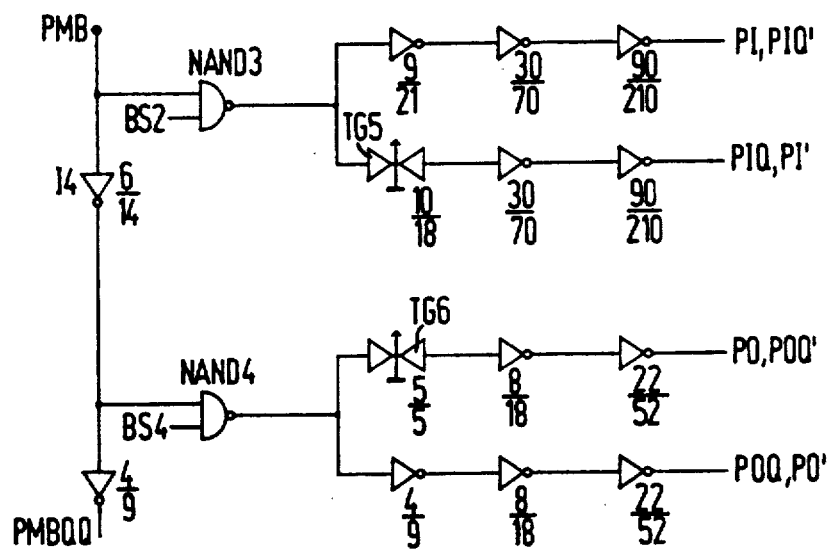
FIG. 6 is a circuit diagram of an input and output clock generator.

FIG. 6 shows the structure of the input/output generator that contains one input clock generator and one output clock generator. The input clock generator contains a first NAND gate NAND3, five inverters and a transfer gate TG5, whereas the output clock generator contains a further NAND gate NAND4, a further five inverters and a second transfer gate TG6. The first input of the NAND gate NAND3 is connected to the first output of the central clock supply PMB, whereas the block select signal BS2 is supplied to the second input of NAND gate NAND3. A first clock output PI, PIQ' of the input clock generator is derived from the output of the NAND gate NAND3 via a first group of three inverters connected following one another and a second clock output PIQ, PI' of the input clock generator is derived from the output of the NAND gate NAND3 via a transfer gate TG5 in series with a first group of two inverters connected following one another. The first input of the NAND gate NAND4 of the output clock generator is connected via the inverter I4 to the first clock output PMB of the central clock supply, whereas the block select signal BS4 is supplied to the second input of the NAND gate NAND4. A first output PO, POQ' of the output clock generator is derived from the output of the NAND gate NAND4 via a transfer gate TG6 having two inverters connected thereto and a second clock output POQ, PO' of the output clock generator is derived from the output of the NAND gate NAND4 via a group of three inverters connected following one another.

The numerical values given in FIGS. 5 and 6 refer to dimensioning proposals, whereby the first numeral refers to the channel width of a n-channel field transistor and the second numeral refers to the channel width of a p-channel field effect transistor. For example, the designation 10/23 for the inverters I11 and I12 denotes that the channel width of the n-channel field effect transistor is 10 μm and that of the p-channel field effect transistor is to 23 μm.

FIG. 7 shows a static register having reset circuit, whereby the reset circuit is located between two transfer gates TG7 and TG8. A Z2I signal is supplied to the input of the static register having reset circuit, the signal Z2Q being taken at the output. The reset circuit contains seven inverters, a NOR gate NOR5 and a NAND gate NAND5. The block select signal BS2 and the block select signal BS4 are connected to the NOR gate NOR5 and a third input of the NOR gate NOR5 is connected to the block select signal BS4 via a group of three inverters I13, I14 and I15 connected following one another. The output of the NOR gate NOR5 is connected via the inverter I16 to a first input of the NAND gate NAND5, whereas the second input of the NAND gate NAND5 is connected via the transfer gate TG7 to the input of the static register having reset circuit. The output of the NAND gate NAND5 is fed back via the inverter I17 to the first input of the NAND gate NAND5 and is connected to the output of the static register having reset circuit via the inverter I18, the following transfer gate TG8 and the inverter I19. The transfer gates TG7 and TG8 are each respectively clocked with two clock pairs PI, PI' and PIQ, PIQ'.

The invention is not limited to the particular details of the apparatus depicted and other modifications and applications are contemplated. Certain other changes may be made in the above described apparatus without departing from the true spirit and scope of the invention herein involved. It is intended, therefore, that the subject matter in the above depiction shall be interpreted as illustrative and not in a limiting sense.

What is claimed is:

1. A memory hierarchically constructed of memory cells, the memory cells being combined into memory groups and each memory group having column and row circuits for selecting, reading and writing each memory cell in the memory group, the memory being divided into at least, low, middle and high hierarchy levels, comprising: the low hierarchy level formed by a memory cell, the middle hierarchy level formed by memory cells combined into memory groups, every next-higher hierarchy level including the high hierarchy level constructed of elements of a next-lower hierarchy level; every hierarchy level having a column and row circuit for selecting, reading and writing the elements of the associated hierarchy level; decoder circuits for column address lines and row address lines in the column and row circuits of lower hierarchy levels being located in higher hierarchy levels; a plurality of pipeline stages connected between the column and row circuits in hierarchy levels that are higher than the middle hierarchy level; and a central clock supply connected to the memories and every element of the high hierarchy level having a respective input/output clock generator, the input/output clock generators controlling data into and out of the elements of the high hierarchy level.

2. The memory hierarchically constructed of memory cells according to claim 1, wherein the memory cells are static memory cells; and wherein every memory cell has a data line for writing information into the memory cell and has a data line for reading information out of the memory cell.

3. The memory hierarchically constructed of memory cells according to claim 1, wherein the high hierarchy level contains first, second, third, fourth and fifth pipeline stages sequentially arranged following one another; wherein first dynamic registers are connected at inputs of the first pipeline stage, second dynamic registers are connected between outputs of the first pipeline stage and inputs of the second pipeline stage, third dynamic registers are connected between outputs of the third pipeline stage and inputs of the fourth pipeline stage, and fourth dynamic registers are connected between outputs of the fourth pipeline stage and inputs of a fifth pipeline stage; wherein static registers without reset circuits and static registers having reset circuits are connected between outputs of the second pipeline stage and inputs of the third pipeline stage; wherein the first pipeline stage contains decoder circuits for the decoding of the row and column address lines and contains amplifier circuits for write/read and data input lines; wherein the second pipeline stage contains amplifier circuits for the row and column address lines and for the write/read and data input lines; wherein the third pipeline stage contains elements of the next-lower hierarchy level and an input/output clock generator allocated to every element, whereby the most significant, decoded address bits are supplied to the input/output clock generators as first block select signals; wherein the third and fourth pipeline stages contain a plurality of NOR gates and the fifth pipeline stage contains a first NAND gate that respectively serve to combine data output lines of the elements of the next-lower hierarchy level; and wherein the dynamic registers are connected for control to a second, third, fourth and fifth clock output ;of the central clock supply.

4. The memory hierarchically constructed of memory cells according to claim 3, wherein every input/output clock generator contains an input clock generator and an output clock generator, first, second and third inverters, a fifth dynamic register, a first transfer gate, a clock control input, a block select input and four clock outputs; wherein the block select input is connected to the first input of the input clock generator and, via the first inverter, connected to the first transfer gate which is connected to the fifth dynamic register which is connected to a first input of the output clock generator; wherein the clock control input is connected to a second input of the input clock generator and, via the second inverter, is connected to a second input of the output clock generator; wherein an output of the second inverter is also connected to a first control terminal of the fifth dynamic register and, via the third inverter to a second control terminal of the third dynamic register an to a control terminal of the first transfer gate; and wherein the input clock generator and the output clock generator have first and second clock outputs, respectively.

5. The memory hierarchically constructed of memory cells according to claim 4, wherein the input clock generator contains a second NAND gate, five inverters and a second transfer gate and the output clock generator contains a third NAND gate, a further five inverters and a third transfer gate; wherein the first input of the input clock generator is connected to a first input of the second NAND gate, the second input of the input clock generator is connected to a second input of the second NAND gate; wherein an output of the second NAND gate forms the first clock output of the input clock generator via a first group of three series connected inverters and forms the second clock output of the input clock generator via the second transfer gate connected in series with a first group of two series connected inverters; wherein the first input of the output clock generator is connected to a first input of a third NAND gate and the second input of the output clock generator is connected to a second input of the third NAND gate; wherein an output of the third NAND gate forms the first clock output of the output clock generator via the third transfer gate connected in series with a second group of two series connected inverters an forms the second clock output of the output clock generator via a second group of three series connected inverters.

6. The memory hierarchically constructed of memory cells according to claim 4, wherein each dynamic register contains at least first and second transfer gates and two series connected inverters; and wherein the two series connected inverters are connected between the first and second transfer gates.

7. The memory hierarchically constructed of memory cells according to claim 4, wherein each transfer gate is constructed of a field effect transistor of a first type and of a field effect transistor of a second type; wherein the field effect transistor of the first type is connected in parallel with the field effect transistor of the second type and a gate terminal of the field effect transistor of the second type forms a second control input and a gate terminal of the field effect transistor of the first type forms a first control input of the transfer gate.

8. The memory hierarchically constructed of memory cells, according to claim 7, wherein the field effect transistor of the first type is an n-channel field effect transistor and the field effect transistor of the second type is a p-channel field effect transistor.

9. The memory hierarchically constructed of memory cells according to claim 3, wherein each static register without a reset circuit contains first and second transfer gates, and first, second and third inverters; wherein the first and second inverters are connected in series between the first and second transfer gates, whereby the first inverter and the first transfer gate are located in an input region and the second transfer gate and the second inverter are located in an output region of the static register; and wherein the third inverter forms a feedback connection between an output of the first inverter and an input of the first inverter.

10. The memory hierarchically constructed of memory cells according to claim 9, wherein each transfer gate is constructed of a field effect transistor of a first type and of a field effect transistor of a second type; wherein the field effect transistor of the first type is connected in parallel with the field effect transistor of the second type and a gate terminal of the field effect transistor of the second type forms a second control input and a gate terminal of the field effect transistor of the first type forms a first control input of the transfer gate.

11. The memory hierarchically constructed of memory cells, according to claim 10, wherein the field effect transistor of the first type is an n-channel field effect transistor and the field effect transistor of the second type is a p-channel field effect transistor.

12. The memory hierarchically constructed of memory cells according to claim 3, wherein in each static register having a reset circuit, the reset circuit is located between first and second transfer gates; wherein the reset circuit contains two block select inputs, a NOR gate, first through sixth inverters and a NAND gate; wherein the first block select input is connected to a first input of the NOR gate and the second block select input is connected to a second input and, via the first, second and third series-connected inverters, is connected to a third input of the NOR gate; wherein an output of the NOR gate is connected via the fourth inverter to a first input of the NAND gate; wherein an output of the first transfer gate is connected to a second input of the NAND gate; wherein an output of the NAND gate is fed back via the fifth inverter onto the second input of the NAND gate; and wherein the output of the NAND gate is connected via the sixth inverter to an input of the transfer gate, an output of the second transfer gate being connected to a seventh inverter.

13. The memory hierarchically constructed of memory cells according to claim 12, wherein each transfer gate is constructed of a field effect transistor of a first type and of a field effect transistor of a second type; wherein the field effect transistor of the first type is connected in parallel with the field effect transistor of the second type and a gate terminal of the field effect transistor of the second type forms a second control input and a gate terminal of the field effect transistor of the first type forms a first control input of the transfer gate.

14. The memory hierarchically constructed of memory cells, according to claim 13, wherein the field effect transistor of the first type is an n-channel field effect transistor and the field effect transistor of the second type is a p-channel field effect transistor.

15. The memory hierarchically constructed of memory cells according to claim 3, wherein each dynamic register contains at least first and second transfer gates and two series connected inverters; and wherein the two series connected inverters are connected between the first and second transfer gates.

16. The memory hierarchically constructed of memory cells according to claim 15, wherein each transfer gate is constructed of a field effect transistor of a first type and of a field effect transistor of a second type; wherein the field effect transistor of the first type is connected in parallel with the field effect transistor of the second type and a gate terminal of the field effect transistor of the second type forms a second control input and a gate terminal of the field effect transistor of the first type forms a first control input of the transfer gate.

17. The memory hierarchically constructed of memory cells, according to claim 16, wherein the field effect transistor of the first type is an n-channel field effect transistor and the field effect transistor of the second type is a p-channel field effect transistor.

18. The memory hierarchically constructed of memory cells according to claim 1, wherein the central clock supply contains a clock input and first, second, third, fourth and fifth clock outputs, a NAND gate, a NOR gate, first and second transfer gates and twenty-eight inverters; wherein the clock input is connected to a first input of the NAND gate and to a first input of the NOR gate; wherein an output of the NAND gate is connected via a first inverter to a second input of the NOR gate; wherein an output of the NOR gate is connected via a second inverter to a second input of the NAND gate; wherein the output of the NAND gate is connected to the first clock output of the central clock supply via three inverters sequentially connected in series; wherein the output of the NAND gate is connected to the second clock output of the central clock supply via the first transfer gate connected in series with a first group of six series connected inverters; wherein a second group of six series connected inverters is connected between the output of the first inverter and the third clock output of the central clock supply; wherein a third group of six series connected inverters is connected between the fourth clock output and an output of the second inverter; and wherein the output of the NOR gate is connected to the fifth clock output of the central clock supply via the second transfer gate connected in series with a fourth group of six series connected inverters.

19. The memory hierarchically constructed of memory cells according to claim 18, wherein each transfer gate is constructed of a field effect transistor of a first type and of a field effect transistor of a second type; wherein the field effect transistor of the first type is connected in parallel with the field effect transistor of the second type and a gate terminal of the field effect transistor of the second type forms a second control input and a gate terminal of the field effect transistor of the first type forms a first control input of the transfer gate.

20. The memory hierarchically constructed of memory cells, according to claim 19, wherein the field effect transistor of the first type is an n-channel field effect transistor and the field effect transistor of the second type is a p-channel field effect transistor.

21. The memory hierarchically constructed of memory cells according to claim 1, wherein the memory is a 16K memory that is divided into sixteen 1K blocks in the high hierarchy level, whereby each 1K block is constructed of sixteen blocks of 64 b its as well as of an input/output clock generator, the plurality of pipeline stages having at least first, second, third, fourth and fifth pipeline stages, and the input/output clock generator having an input clock generator and an output clock generator, each having first and second clock outputs; wherein the memory has at least address lines, a write/read line, a data input line and data output line and a first clock input connected to the central clock allocated to the memory; wherein uppermost addresses received on the address lines are decoded into first block select signals via a 4:16 address decoder in the first pipeline stage, the first block select signals being supplied via a first inverter to respectively one block select input of the appertaining input/output generator; wherein middle addresses received on the address lines are each decoded into a first group of four row and column address lines via two 2:4 decoders, the row and column address lines serving for the selection of rows or columns of 64 bit blocks; wherein low addresses received on the address lines are decoded into a second group of eight row and column address lines via two 3:8 decoders, the row and column address lines serving for the selection of a row or column within the 64 bit blocks; wherein first amplifier circuits for the first and second groups of row and column address lines in the second pipeline stage and second amplifier circuits for the write/read line and for the data input line in the first and second pipeline stage are each composed of two series-connected inverters; wherein the four row address lines of the first group of four row and column address lines for the selection of a row of 64 bit blocks are connected to every 1K block via a static register having a reset circuit and the four column lines of the first group of four row and column address lines for the selection of a column of 64 bit blocks, as well as the eight row lines and eight column lines of the second group of eight row and column address lines that serve for the selection of rows or columns within the 64 bit blocks are each connected to every 1K block via a static register; wherein the write/read line connected to an input of the third pipeline stage is split into a write line and into a read line, whereby the read line is connected via a respective static register to a 1K block and the write line is connected to the 1K block from an output of a transfer gate of the respective static register via an inverter in series with a following transfer gate; wherein the 64 bit blocks have four rows of four data lines which are combined via a first NOR gate having four inputs and one output, whereby the first NOR gate is located within the fourth dynamic register and is connected between an output of the third pipeline stage and an input of the fourth pipeline stage; wherein a resistor element has a first terminal connected to the juncture of the output of the third pipeline stage and the input of the fourth pipeline stage and has a second terminal connected to a reference potential; wherein respectively eight of the sixteen data lines of the 64 bit blocks are combined via second and third NOR gates each having eight inputs and one output, whereby respectively one NOR gate of the second and third NOR gates having an inverter connected to its output is located in the fourth pipeline stage and the outputs of the second and third NOR gates are further connected to two inputs, respectively of a first NAND gate having one output, whereby the first NAND gate is located within the fifth dynamic register and is connected to an output of the fourth pipeline stage and to an input of the fifth pipeline stage; wherein the central clock supply has second, third, fourth and fifth clock outputs connected to the first, second, fourth and fifth dynamic registers; and wherein the first and second clock outputs of the input clock generator are connected to the static registers and to the static registers having reset circuits, whereas the first and second clock outputs of the output clock generators are connected to the fourth dynamic register.

22. The memory hierarchically constructed of memory cells according to claim 21, wherein each transfer gate is constructed of a field effect transistor of a first type and of a field effect transistor of a second type; wherein the field effect transistor of the first type is connected in parallel with the field effect transistor of the second type and a gate terminal of the field effect transistor of the second type forms a second control input and a gate terminal of the field effect transistor of the first type forms a first control input of the transfer gate.

23. The memory hierarchically constructed of memory cells, according to claim 22, wherein the field effect transistor of the first type is an n-channel field effect transistor and the field effect transistor of the second type is a p-channel field effect transistor.

* * * * *